(12) United States Patent
Taussig et al.

(10) Patent No.: US 6,385,075 B1
(45) Date of Patent: May 7, 2002

(54) PARALLEL ACCESS OF CROSS-POINT DIODE MEMORY ARRAYS

(75) Inventors: Carl Taussig, Redwood City; Richard Elder, Palo Alto, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/875,828

(22) Filed: Jun. 5, 2001

(51) Int. Cl.$^7$ .............................................. G11C 17/06
(52) U.S. Cl. ....................... 365/105; 365/175; 365/243
(58) Field of Search ................................ 365/105, 175, 365/243

(56) References Cited

U.S. PATENT DOCUMENTS

| | | | | |
|---|---|---|---|---|
| 4,954,989 A | * | 9/1990 | Auberton-Herve et al. | 365/177 |
| 5,905,670 A | * | 5/1999 | Babson et al. | 365/105 |
| 6,256,767 B1 | * | 7/2001 | Kuekes et al. | 257/23 |

* cited by examiner

Primary Examiner—Huan Hoang

(57) ABSTRACT

A memory circuit includes a cross-point memory array having first and second sets of transverse electrodes with respective memory elements formed at the crossing-points of the first and second set electrodes. Each of the memory elements is formed to include, in at least one of its binary states, a diode element. The memory circuit also includes an addressing circuit coupled to the memory array. The addressing circuit has a first set of address lines with first diode connections between the first set address lines and the first set memory array electrodes, with the first diode connections coupling each memory array electrode in the first set to a respective unique subset of the first set address lines. The addressing circuit also has a second set of address lines with second diode connections between the second set address lines and the second set memory array electrodes, with the second diode connections coupling each memory array electrode in the second set to a respective unique subset of the second set address lines. The addressing circuit further includes at least one sense line with diode connections to each of the first set memory array electrodes and/or the second set memory array electrodes. A plurality of the memory circuits can be provided with the address lines coupled for parallel addressing, and the addressed memory element from each memory array is accessible for reading/writing using the respective sense line(s).

29 Claims, 9 Drawing Sheets

PARALLEL ACCESS OF CROSS-POINT DIODE MEMORY ARRAYS

FIELD OF THE INVENTION

The present invention relates to the field of digital memory circuits, and in particular to parallel addressing and sensing of memory elements in cross-point diode memory arrays.

BACKGROUND OF THE INVENTION

Many consumer devices are now constructed to generate and/or utilize digital data in increasingly large quantities. Portable digital cameras for still and/or moving pictures, for example, generate large amounts of digital data representing images. Each digital image may require up to several megabytes (MB) of data storage, and such storage must be available in the camera. To provide for this type of data storage application, the storage memory should be relatively low in cost for sufficient capacities of around 10 MB to 1 gigabyte (GB). The storage memory should also be low in power consumption (e.g. <<1 Watt) and have relatively rugged physical characteristics to cope with the portable battery powered operating environment. For archival storage, data need only be written to the memory once. Preferably the memory should have a short access time (in the order of milliseconds) and moderate transfer rate (e.g. 20 Mb/s). Preferably, also, the storage memory should be able to be packaged in an industry standard interface module, such as PCMCIA or Compact Flash card.

One form of storage currently used for application in portable devices such as digital cameras is Flash memory. This meets the desired mechanical robustness, power consumption, transfer, and access rate characteristics mentioned above. However, a major disadvantage is that Flash memory remains relatively expensive ($1.50–$2 per MB). Because of the price it is generally unreasonable to use Flash memory storage as an archive device, thus requiring data to be transferred from it to a secondary archival storage.

Magnetic "hard disc" storage can be used for archival storage, even in portable devices. Miniature hard disc drives are available for the PCMCIA type III form factor, offering capacities of up to 1 GB. However, such disc drives are still relatively expensive ($0.5 per MB), at least partially because of the relatively high fixed cost of the disc controller electronics. Miniature hard drives have other disadvantages when compared to Flash memory, such as lower mechanical robustness, higher power consumption (~2 to 4W), and relatively long access times (~10 mS).

Removable optical storage discs can similarly be used, and offer one large advantage compared to hard disc. The removable optical media is very inexpensive, for example of the order of $0.03 per MB for Minidisc media. However in most other respects optical disc storage compares poorly with magnetic hard discs including relatively poor power consumption, mechanical robustness, bulk, and access performance.

Another form of archival storage is described in co-pending U.S. patent application Ser. No. 09/875,356, entitled "Non-Volatile Memory", the disclosure of which is hereby incorporated herein by reference. The memory system disclosed therein aims to provide high capacity write-once memory at low cost for archival storage. This is realized in part by avoiding silicon substrates, minimizing process complexity and lowering areal density. The memory system includes a memory module formed of a laminated stack of integrated circuit layers constructed on plastic substrates. Each layer contains cross-point diode memory array, and sensing of the data stored in the array is carried out from a separate integrated circuit remotely from the memory module. In order to address, read from and write to all of the memory elements in the arrays of the various memory module layers, a multiplexing scheme is required to avoid having too many interconnections between the memory module and the remote sensing circuitry.

In conventional integrated circuits multiplexing is accomplished by logic gates synthesized from transistors. It is undesirable to include transistors in a diode based cross-point memory array because they will add to the required processing thereby increasing the fabrication cost. Some of the additional processing may be incompatible with other materials used in the cross-point array. If plastic substrates or organic semiconductors are used to form the cross-point memory array, for example, they may be destroyed by temperatures required for transistor fabrication, or they could be damaged by certain solvents used in a wet etching process. Recently, researchers at Lawrence Livermore Laboratories have demonstrated the fabrication of thin-film-transistors on a plastic substrate, however the process required is much more complicated, and hence more expensive, than the equivalent process required to fabricate diodes.

Electrostatic micro-relays have been developed for a number of applications including power relays for automotive application, and small signal switching for instrumentation and automatic test equipment. Electrostatic micro-relay systems are described, for example, in Wong, Jo-Ey, et al., "An Electrostatically-actuated MEMS Switch for Power Applications", (Micro Electro-Mechanical Systems, 2000. MEMS '00. Thirteenth IEEE. 2000), and Zavracky, P. M., et. al., "Micro-mechanical switches fabricated using nickel surface micro-machining", (Micro-electromechanical Systems, Journal of, 1997.6(1): p3–9). The principle advantages of this technology are low power consumption and simplicity of construction. The processing for these devices is still more significant than that required for a simple diode array, however, particularly if a low contact resistance is required. Other problems associated with electrostatic micro-relays are fatigue life and switching speed.

A third possibility, code-word addressing, includes a number of approaches which have been used to minimize the interconnections to a pixelated display. Such systems are described, for example, in the specification of International Patent Application Publication WO 98/44481, and U.S. Pat. No. 5,034,736. In general code word addressing trades off the ratio of addressing lines to array electrodes and the cross-talk between selected and de-selected electrodes. Although these solutions do not offer log-base-2 reduction in interconnect, they may offer better than 10:1 ratio of electrode to address line, while maintaining a 4:1 cross-talk ratio. Although these solutions are relatively simple to implement, they require a higher number of address lines for a given number of addressed lines than the true multiplexing schemes described previously. A further disadvantage is the cross-talk introduced between addressed and non-addressed memory elements, which makes it difficult to read and write a particular memory element.

SUMMARY OF THE INVENTION

In accordance with the principles of the present invention, there is provided an addressing circuit for addressing a cross-point memory array having first and second sets of electrodes from first and second sets of address lines. The addressing circuit has first diode connections between the first set address lines and the first set memory array electrodes, with the first diode connections coupling each memory array electrode in the first set to a respective unique subset of the first set address lines. Second diode connections are provided between the second set address lines and the second set memory array electrodes, with the second diode connections coupling each memory array electrode in the second set to a respective unique subset of the second set address lines. At least one sense line is also provided with diode connections to each of the first set memory array electrodes and/or the second set memory array electrodes.

In the preferred construction of the addressing circuit, the first diode connections comprise diodes elements with anodes coupled to the respective memory array electrodes and cathodes coupled to the respective address lines, and the second diode connections comprise diode elements with cathodes coupled to the respective memory array electrodes and anodes coupled to the respective address lines.

Preferably the cross-point memory array comprises an array of diode based memory elements formed at cross-points of electrodes from the first and second sets, with ends of the electrodes coupled to power supply connections through respective resistive elements. In a preferred embodiment the power supply connections are arranged in power supply striping groups to enable power to be selectively supplied to portions of the cross-point array.

A plurality of cross-point memory arrays can be provided each with respective first diode connections, second diode connections and at least one sense line, and the address lines being coupled in parallel to the plurality of first and second diode connections. With this construction the plurality of memory arrays can be addressed in parallel with outputs therefrom being accessible on through the respective sense lines.

In one form of the invention the addressing circuit includes first and second sense lines, the first sense line having diode connections to each of the first set memory array electrodes, and the second sense line having diode connections to each of the second set memory array electrodes.

The present invention also provides an integrated circuit including at least one cross-point diode memory array and addressing circuit as described above. In a preferred form of the invention, the cross-point diode memory array and addressing circuit are formed in the same fabrication process.

In accordance with the present invention there is also provided a memory circuit including a cross-point memory array having first and second sets of transverse electrodes with respective memory elements formed at the crossing-points of the first and second set electrodes. Each of the memory elements is formed to include, in at least one of its binary states, a diode element. The memory circuit also includes an addressing circuit coupled to the memory array. The addressing circuit has a first set of address lines with first diode connections between the first set address lines and the first set memory array electrodes, with the first diode connections coupling each memory array electrode in the first set to a respective unique subset of the first set address lines. The addressing circuit also has a second set of address lines with second diode connections between the second set address lines and the second set memory array electrodes, with the second diode connections coupling each memory array electrode in the second set to a respective unique subset of the second set address lines. The addressing circuit further includes at least one sense line with diode connections to each of the first set memory array electrodes and/or the second set memory array electrodes.

In the preferred construction of the memory circuit, the diode elements of the first diode connections are oriented differently from the diode elements of the second diode connections with respect to the memory array electrodes and address lines.

Preferably, ends of the memory array electrodes are coupled to power supply connections through respective resistive elements, with the power supply connections being arranged in power supply striping groups to enable power to be selectively supplied to portions of the cross-point array.

According to a preferred embodiment, a memory circuit may comprise a plurality of cross-point memory arrays and respective addressing circuits as described above, wherein the address lines from the respective addressing circuits are coupled in parallel.

In one form of the memory circuit the addressing circuit includes first and second sense lines, the first sense line having diode connections to each of the first set memory array electrodes, and the second sense line having diode connections to each of the second set memory array electrodes.

The first diode connections can be formed at crossing-points of the first address lines and the first set electrodes, and the second diode connections formed at crossing-points of the second address lines and the second set electrodes.

The present invention also provides an integrated circuit having at least one memory circuit as described above. The memory array and addressing circuit can be formed in the same fabrication process. Furthermore, the integrated circuit may be formed on a dielectric substrate surface.

The present invention further provides a memory module comprising a plurality of integrated circuits as described above. In a preferred form of the invention, the memory module is constructed with a plurality of integrated circuits as above described stacked on top of one another.

The present invention further provides a method for addressing a cross-point memory array having first and second sets of electrodes from first and second sets of address lines. The method includes forming first diode connections between the first set address lines and the first set memory array electrodes, with the first diode connections coupling each memory array electrode in the first set to a respective unique subset of the first set address lines. The method also includes forming second diode connections between the second set address lines and the second set memory array electrodes, with the second diode connections coupling each memory array electrode in the second set to a respective unique subset of the second set address lines. At least one sense line is provided with diode connections to each of the first set memory array electrodes and/or the second set memory array electrodes. Addressing of a memory element in the memory array may then be accomplished by applying a predetermined electrical signals to the first and second set address lines to enable detection of the state of the memory element using the at least one sense line.

Preferably the first and second diode connections and the sense line or lines are formed during the same fabrication process as the cross-point memory array.

A plurality of cross-point memory arrays may be formed with respective first and second diode connections and sense lines, wherein the predetermined electrical signals are applied to the address lines of the plurality of memory arrays in parallel to obtain separate memory element sense outputs on the respective sense lines.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENT

Write-once memory circuits, storage systems, addressing and sensing circuits and methods for producing, implementing and using such circuits and systems are disclosed herein. In the following description, for purposes of explanation, specific nomenclature and specific implementation details are set forth to provide a thorough understanding of the present invention. However, it will be apparent to one skilled in the art that these specific details are not necessarily required in order to practice the present invention.

In the following description, where "data" is referred to it will be appreciated that such "data" may be represented in various ways depending upon the context. As an example, "data" in a memory cell might be represented by a voltage level, a magnetic state, or a physical characteristic such as electrical resistance that presents a measurable effect such as voltage or current level or change to a sensing circuit, for instance. On the other hand, whilst on a bus or during transmission such "data" might be in the form of an electrical current or voltage signal. Furthermore, herein "data" in most circumstances is primarily binary in nature which may for convenience be referred to as represented by states of "0" and "1", but it will be appreciated that the binary states in practice might be represented by relatively different voltages, currents, resistances or the like and it is generally immaterial whether a particular practical manifestation represents a "0" or a "1".

A preferred embodiment of the present invention comprises an addressing circuit and a method of addressing cross-point diode memory arrays of the type utilized in the memory system described in the aforementioned co-pending U.S. patent. In order to provide a thorough understanding of the invention, the following detailed description is therefore presented in the context of such a memory system, although those skilled in the art will recognize that the invention is not limited in application to the described structure.

A Write-Once Memory System

Figure 1:
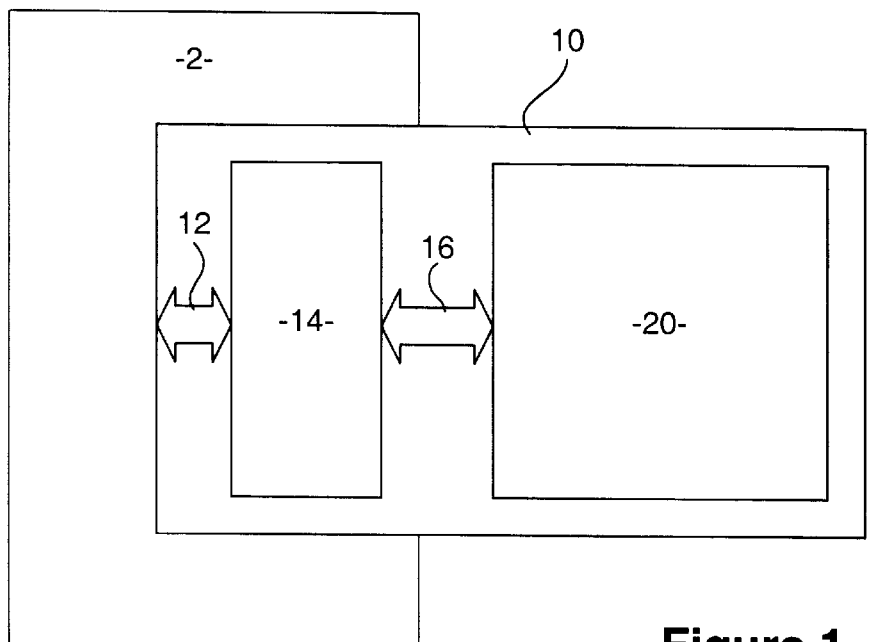
FIG. 1 is a block diagram of a write-once memory system according to an embodiment of the invention.

A portable, inexpensive, rugged memory system that is particularly useful for data storage in applications such as digital cameras and portable digital audio devices, amongst other things, is embodied by the memory card 10 illustrated in block diagram form in FIG. 1. The memory system may be incorporated into an industry standard portable interface card (e.g. PCMCIA or CF) so that it can be used in existing and future products with such interfaces. The memory card 10 has an I/O interface connector 12 through which communication is made between the card 10 and a device 2 to which it is coupled. The interface connector is coupled to an interface and control circuit 14 which is connected to a removable memory module 20. The memory module 20 provides circuitry for write-once data storage, including some detection, write enabling and addressing functions. The interface and control circuit 14 comprises circuitry for control, interface, detection, error correction coding (ECC) and the like for each removable memory module 20 when it is received in the card. The memory module 20 is received in a socket or the like in the memory card, so that it may be removed therefrom and replaced with another memory module 20. When received in the memory card, the memory module 20 is coupled to the interface and control circuit 14 through an internal interface 16.

Write-once data storage means that, effectively, data can only be written once to the memory and thereafter it remains unchangeable. In many forms of write-once memory it is not strictly true that the data stored therein cannot be changed at all after being initially written, however in general it cannot be changed arbitrarily, as those skilled in the art will appreciate. For example, most write-once memories are fabricated with each memory cell in a first binary state (e.g. representing a binary data "0"), and during a write procedure selected memory cells are changed into a second binary state (e.g. to represent the binary data "1"s). Often the change in the memory from the first binary state to the second is irreversible, such that once a data "1" is written it cannot be changed back to a data "0". This restricts the changes to the stored data that can be made after it has been written to the memory, wherein arbitrary data can only be written once and thereafter data "0"s, for example, can only be changed to data "1" s, and not the other way around.

Since the memory module 20 contains write-once memory, it is appropriate for archival data storage wherein the data, once stored, is preserved. This is somewhat like a photographic film, where pictures are stored thereon once, and the developed film is kept as a permanent record. Therefore, once the memory module 20 has been filled to capacity with data, another is required for further data storage. It would be possible to simply replace the entire memory card 10 in the device 2, however that would mean the interface and control circuitry, as well as the memory card structure, is archived along with the memory module. In order to reduce the data storage costs it is desirable that reusable and relatively expensive components of the memory system not be permanently coupled to the actual storage memory, and for that reason the memory module 20 is removable from the memory card 10 in the preferred embodiment. The bulk of the memory card 10 thus involves a one-off cost, and the memory modules 20 for insertion therein are fabricated inexpensively as discussed further hereinbelow.

A Write-Once Memory Module

Figure 2:
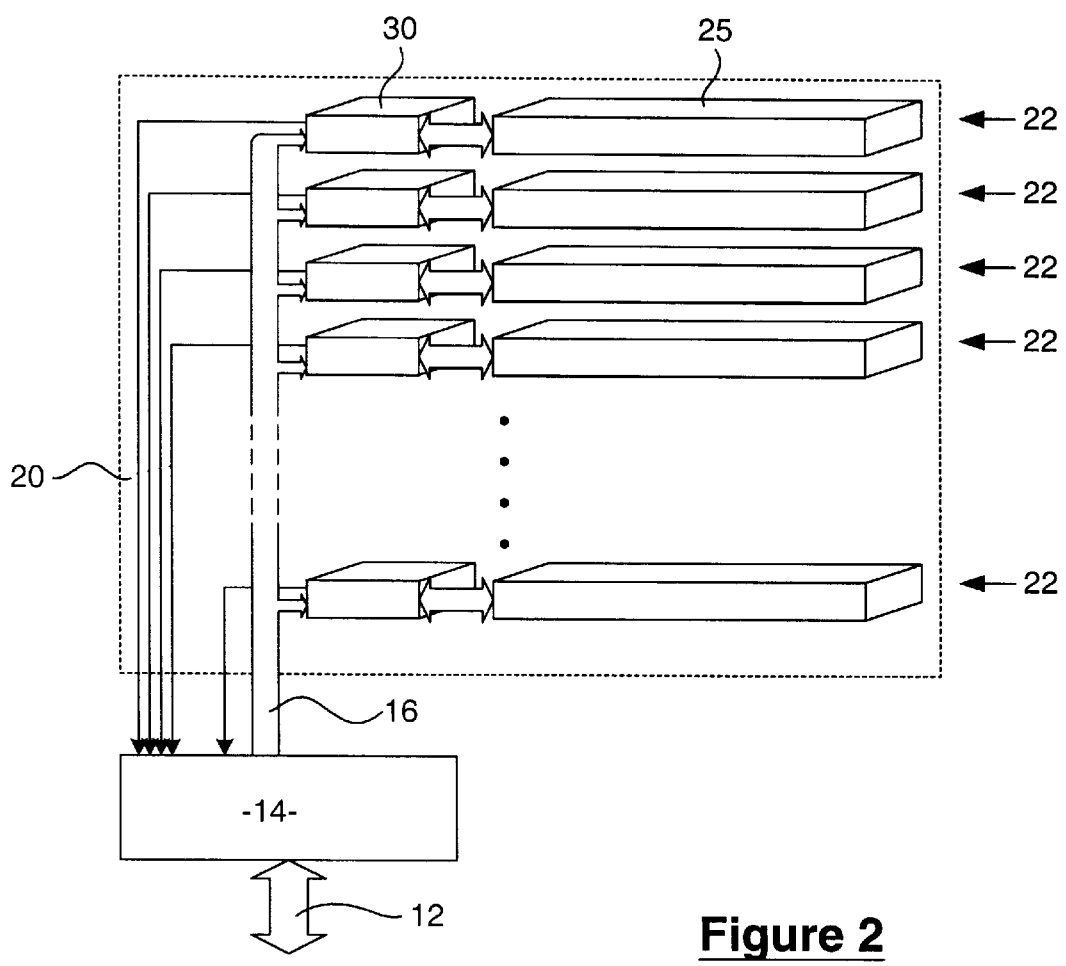
FIG. 2 is a schematic block diagram of the write-once memory system illustrating the general structure of a memory module thereof.

A diagrammatic block representation of a memory module 20 is shown in FIG. 2, coupled to an interface and control circuit 14. In order in increase storage capacity of the memory module for a given base area, the module 20 is constructed from a stack of laminated layers 22. Each layer 22 has an array 25 of memory elements that provide the data storage. The layers also each include addressing circuitry 30 coupling the respective memory arrays through the memory system internal interface 16 to the interface and control circuit 14. The addressing circuitry on each layer enables fewer interconnecting conductors between the layers of the memory module, which facilitates ease of fabrication and thus lowered costs.

Figure 3:
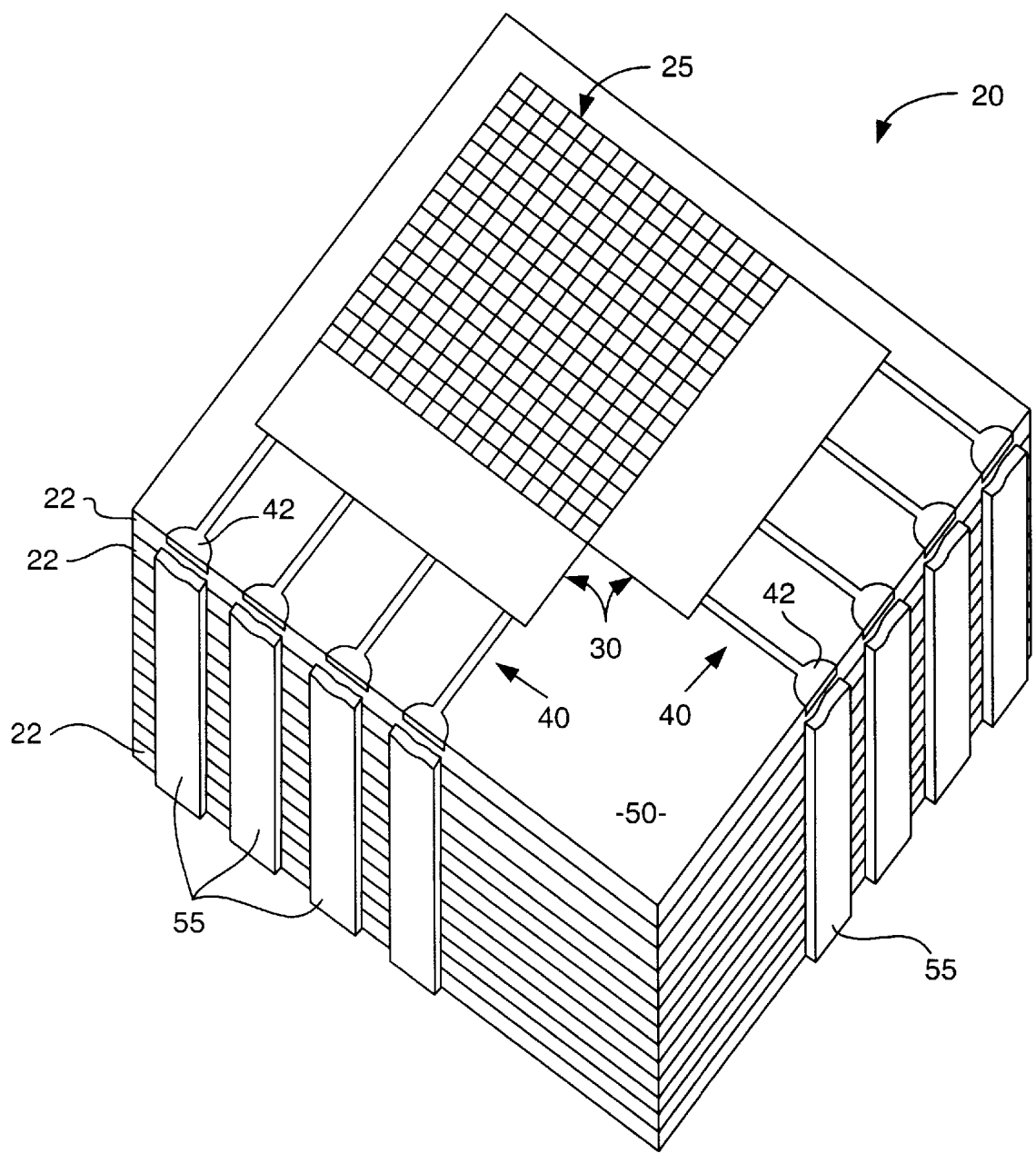
FIG. 3 is a cut-away isometric view of a write-once memory module constructed in accordance with an embodiment of the invention.

FIG. 3 is a cut-away isometric view of a memory module 20, illustrating a possible physical arrangement of circuits and layers in the memory module. Each of the layers 22 comprises a memory array 25 and addressing circuits 30 formed on a substrate 50. The memory array 25 comprises a matrix of memory elements 26. The addressing circuits 30 comprise column and row multiplexing (mux) circuit portions that are shown positioned adjacent respective orthogonal edges of the memory array 25. Input/output (I/O) leads 40 are also formed on the substrate during the fabrication process. In the memory module 20, row I/O leads extend from the row mux circuit to a first adjacent edge of the substrate, and column I/O leads (40b) extend from the column mux circuit to a second adjacent edge of the substrate. Each of the leads 40 terminate at respective contact pads 42, portions of which are exposed at the edges of the substrate 50.

A plurality of layers 22 are stacked in the same orientation and laminated together. Electrical contact is made to the exposed portions of the contact pads 42 of the stacked layers by conductive contact elements 55, which are illustrated in partial cut-away view in FIG. 3. The contact elements 55 extend along the sides of the memory module 20, transverse to the plane of the individual layers 22. Each contact element 55 as illustrated makes electrical contact to a respective contact pads of a plurality of the layers in the stack. The contact elements 55 can be used to couple the memory module through the memory system internal interface 16 to the interface and control circuit 14.

In the preferred implementation of the memory module the substrate 50 for each of the layers 22 is formed from a polymer plastics material. The processes by which the integrated circuits (e.g. memory array and addressing circuitry) can be formed on the substrate, and the layers assembled into a memory module are described in detail in the specification of the aforementioned co-pending U.S. patent application.

A Write-Once Memory Array

Figure 4:
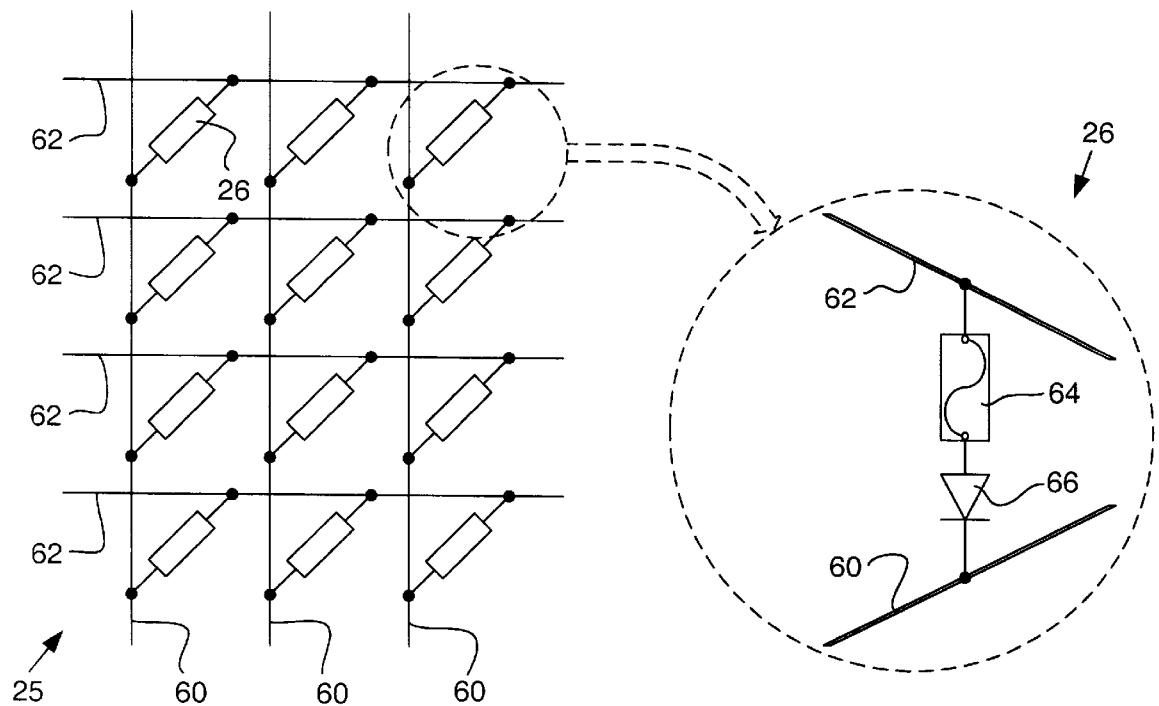
FIG. 4 is a pictorial diagram of a cross-point memory element suitable for implementation in embodiments of the invention.

An array 25 of memory elements 26 is formed on each of the layers in the memory module 20. The memory array comprises a regular matrix of column lines and row lines with a memory element at each column/row intersection. FIG. 4 illustrates a schematic diagram of a portion of a memory array 25 having column lines 60 and row lines 62. Coupled between each of the column lines and row lines is a memory element 26, which is also shown in greater detail in an expanded portion of the diagram in FIG. 4. In the preferred implementation of the memory array, each memory element 26 comprises a fuse element 64 coupled in series with a diode element 66. The fuse element 64 provides the actual data storage effect of the memory element, whilst the diode 66 facilitates addressing of the memory element using the row and column lines for writing and reading data.

The preferred operation of the memory array 25 is as follows. At fabrication, each of the memory elements 26 has a fuse element 64 that is conductive. The conductive state of the fuse element represents one binary data state, say a data "0". In order to write data to the memory array, each memory element in which it is desired to store a data "1" is addressed using the column and row lines and the fuse element therein is "blown", placing it in a non-conductive state. The non-conductive state of the fuse element represents the other binary data state, say a data "1". Blowing the fuse element is a one-way operation, which makes the memory a "write-once" storage, as discussed hereinabove. A data writing operation (e.g. writing a data "1" to a selected memory element) can be performed by applying a predetermined current through a selected row line to a selected column line, for example, sufficient to blow the fuse of the memory element that directly interconnects those row/column lines. Data can be read from the memory array by addressing memory elements using the column and row lines and sensing which memory elements are conductive (data "0"s) and which are non-conductive (data "1"s).

The diode element 66 in each memory element 26 of the array assists in addressing the memory elements uniquely using the column and row lines for writing and reading data. Without a diode in the row/column cross-point memory elements there are current paths through many memory elements between a given column line and row line. However, with the diodes element forming a one-way conduction path through each memory element, a single column line and single row line can be used to uniquely address a single memory element. In other words, forming a circuit from one row line to one column line permits current to pass through only a single memory element. By applying a predetermined "data writing" current through that circuit, the fuse in the memory element can be blown to change a data "0" to a data "1". Also, by sensing the resistance in the circuit it is possible to determine whether the memory element fuse is blown or intact, thereby reading a data "1" or data "0".

Thus, the diodes 66 reduce the incidence of cross-talk between the memory elements in the memory array during reading and writing operations. Furthermore, the non-linear current-voltage (I–V) characteristics of the diodes improves the data sensing signal-to-noise ratio (SNR), which assists in remote sensing and code-word addressing. The data in the memory module is sensed remotely since the sensing circuitry is in the interface and control circuit 14, which is contained in a separate integrated circuit. Also, permuted diode logic addressing of the memory elements is employed, using the addressing circuits as described hereinbelow, in order to reduce the number of connections required between the memory module 20 and the interface and control circuit 14.

Figure 5:
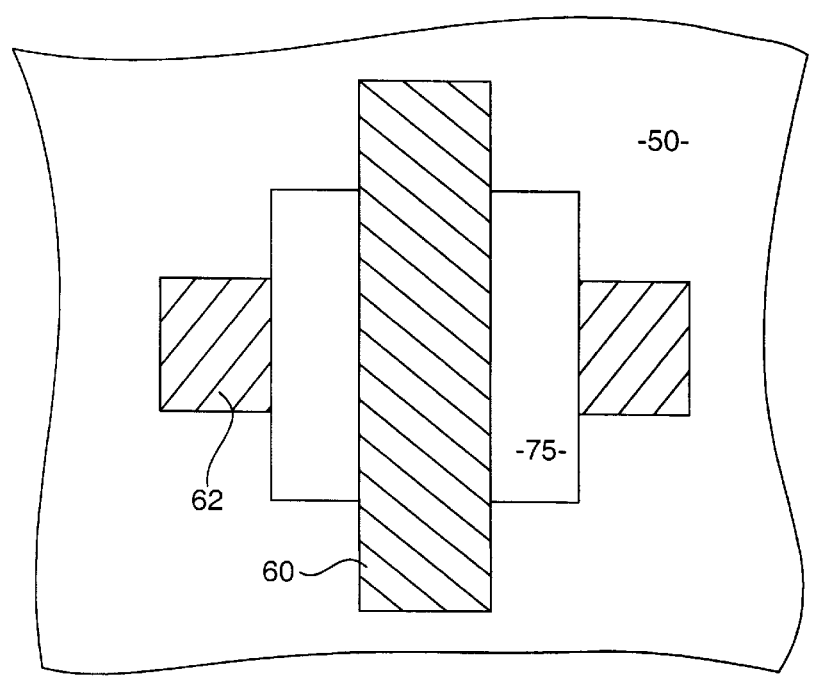
FIG. 5 is a simplified plan view of a cross-point array memory unit cell.

The memory array is sometimes herein referred to as a cross-point array memory in view of the structure thereof, and FIG. 5 provides a simplified plan view of a unit cell of the memory array of the preferred embodiment. The basic structure of the cross-point array memory comprises two layers of orthogonal sets of spaced parallel conductors arranged with a semiconductor layer therebetween. The two set of conductors form row and column electrodes overlaid in such a manner that each of the row electrodes intersects each of the column electrodes at exactly one place. At each of these intersections a connection is made between the row electrode (62 in FIG. 5) and column electrode (60 in FIG. 5) through the semiconductor layer (75 in FIG. 5) which acts in the manner of a diode and a fuse in series. The diodes in the array are all oriented so that if a common potential is applied between all the row electrodes and all the column electrodes then all the diodes will be biased in the same direction. The fuse element may be realized as a separate element which will open circuit when a critical current is passed therethrough or it may be incorporated in the behavior of the diode.

Although commonly in this description the semiconductor layer (e.g. 75) is referred to in the singular, in practice a plurality of layers of different materials may be employed. The layers may include materials that are not semiconductors, such as metals and even dielectrics in various configurations. The materials and structures suitable for implementing the desired functions are described in detail elsewhere.

Figure 6:
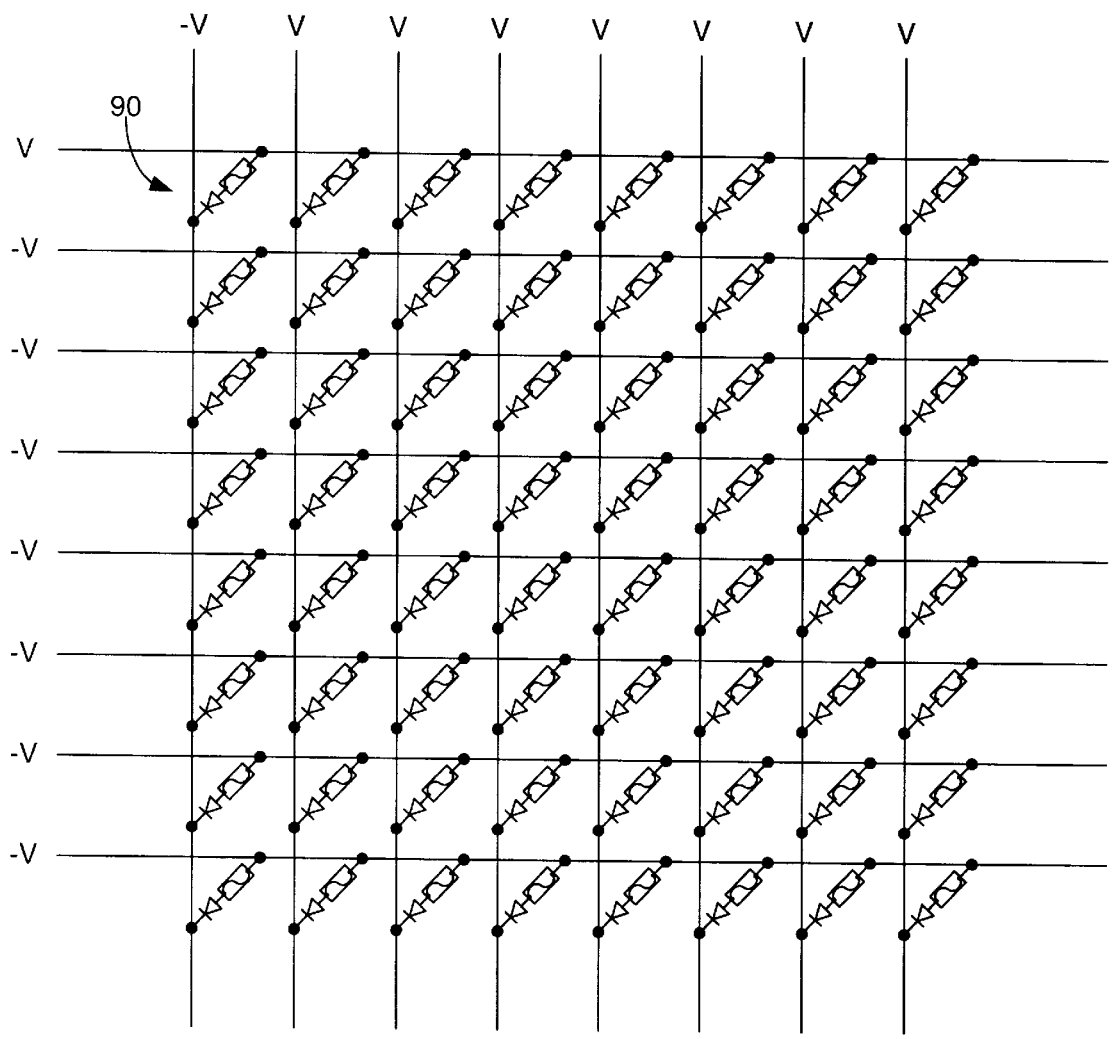
FIG. 6 shows a write-once memory array for illustration of addressing memory elements thereof.

FIG. 6 is a schematic representation of a cross-point write-once diode memory array. The figure shows an eight row by eight column array. If voltages are applied to the row and column electrodes as depicted (i.e. all the column electrodes are a potential V except for one which is at −V, and all the row electrodes are at −V except for one which is at V), then only one diode will be forward biased. For the case depicted in FIG. 6 only the diode (90) in the upper left corner of the array will be forward biased. The diodes in the top row and left-most column will have no bias on them and the remaining diodes in the array will be reverse biased. This constitutes an addressing scheme for the array. If a current flows between the rows and columns with the electrodes at these potentials than the fuse of the upper left diode is intact (e.g. representing a data "0"). Conversely, if no current flows in this configuration then the corresponding diode/fuse has been blown (e.g. representing a data "1"). By modulating the amplitudes of the voltages applied to the array electrodes more current can be made to flow through the selected diode. If this voltage causes a current that exceeds the threshold current of the fuse then the fuse can be blown, changing the state of the memory element. This constitutes a method for writing to the memory.

The actual current required to blow a fuse in the memory array (or the voltage to be applied to achieve that current) should be predictable and controllable at the time of fabrication. Since it is current density through the memory elements that is the operative factor, the applied voltage/current at which an element will blow can be adjusted by varying the junction area of the element. For example, if the cross-sectional area of the intersection of the cross-point electrodes is reduced this also reduces the current/voltage required to be applied to reach the critical current density to blow the fuse. This scheme can be used in the design and fabrication of the memory circuits to ensure that control voltages can be applied to blow only the desired cross-point fuses.

Memory Array Addressing Circuitry

In order to simplify interconnections to the memory module it is desirable to use a multiplexed addressing scheme for accessing the memory elements. In other words, it is desirable that each memory element in a memory array be uniquely addressable from an external circuit through addressing lines that are fewer in number than the total of the array row and column lines. To that end, addressing circuitry (30) is included on the same substrate as the memory array.

The addressing circuitry of the preferred embodiment is sometimes referred to herein as performing a multiplexing (mux) and/or de-multiplexing (demux) function. In the context of this specification the term "multiplexing" is understood to encompass the form of permuted diode logic addressing utilized in the preferred embodiment, even though the selection scheme is somewhat different from traditional multiplexing arrangements.

Figure 7:
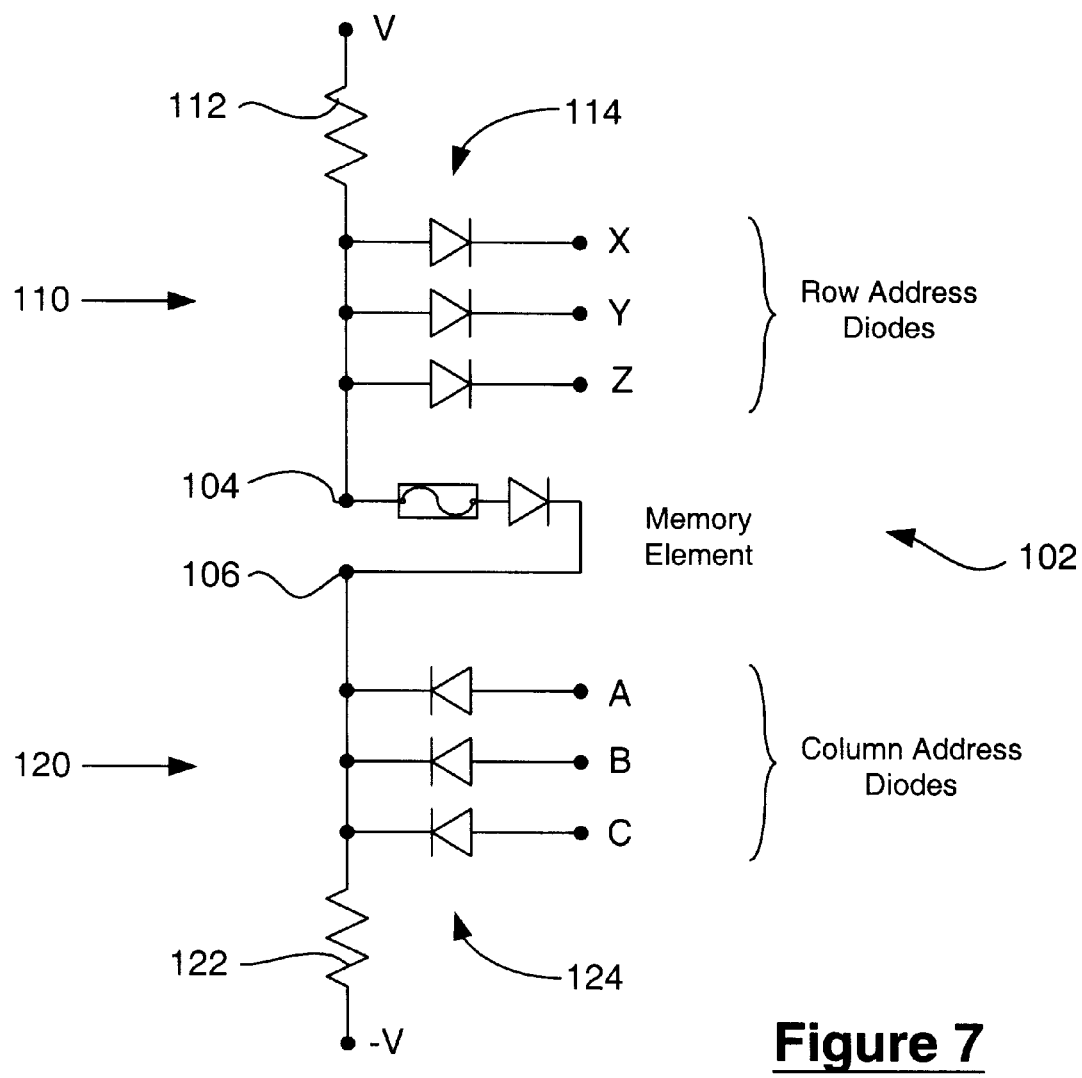
FIG. 7 is a schematic circuit diagram of a portion of a memory array addressing circuit.

In the preferred embodiment, the address mux/demux functions are carried out using a logic scheme referred to as permuted diode logic, which is described hereinbelow. FIG. 7 illustrates a single write-once memory element 102 represented by a fuse and diode in series. The memory element 102 is coupled between a row electrode 104 and a column electrode 106. A row address diode logic circuit 110 is coupled to the row electrode 104, and a column address diode logic circuit 120 is coupled to the column electrode 106. The row address circuit 110 as shown comprises a resistive element 112 coupled between the row electrode and a pull-up voltage +V. The row address circuit 110 also comprises plurality of row address diodes 114 having anodes coupled to the row electrode and cathodes controlled by respective row address input voltages represented by X, Y and Z. A column address diode logic circuit 120 is similarly constructed with a resistive element 122 coupled from the column electrode 106 to a pull-down voltage −V. A plurality of column address diodes 124 have their cathodes coupled to the column electrode, and anodes controlled by respective column address input voltages represented by A, B and C.

Consider firstly the row address circuit 110 in which logic levels of +V and −(V+ΔV) are used for the row address input voltages (X, Y, Z). It will be apparent that, where voltage +V represents a logic "1", the row address circuit 110 acts like an AND gate with the diode cathodes (X, Y, Z) as inputs and the row electrode 104 as output. The row electrode 104 is high (+V) only if all three row address inputs (X, Y, Z) are high. Similarly, the column address circuit 120 acts like a negative logic AND gate. In this case, if logic levels of −V and (V+ΔV) are applied at the column address inputs (A, B, C), the output at the column electrode 106 will only be −V when all three inputs are at −V. If the row address inputs (X, Y, Z) all apply cathode voltages of +V to the diodes 114 and the column address inputs (A, B, C) all apply anode voltages of −V to the diodes 124 then the memory element 102 is selected. Although in FIG. 7 only three-input circuits are illustrated, this addressing scheme can be extended to include an arbitrary number of inputs.

There are $n^d$ permutations when one item is selected from each of d groups of n nodes. Therefore, $n^d$ electrodes can be connected through diodes to one out of n nodes in each of d groups. If a high logic level is applied to exactly one node in each group then only one electrode will be selected, since all lines connected to an electrode must be high to select it and no two electrodes share the identical connections.

Figure 8:
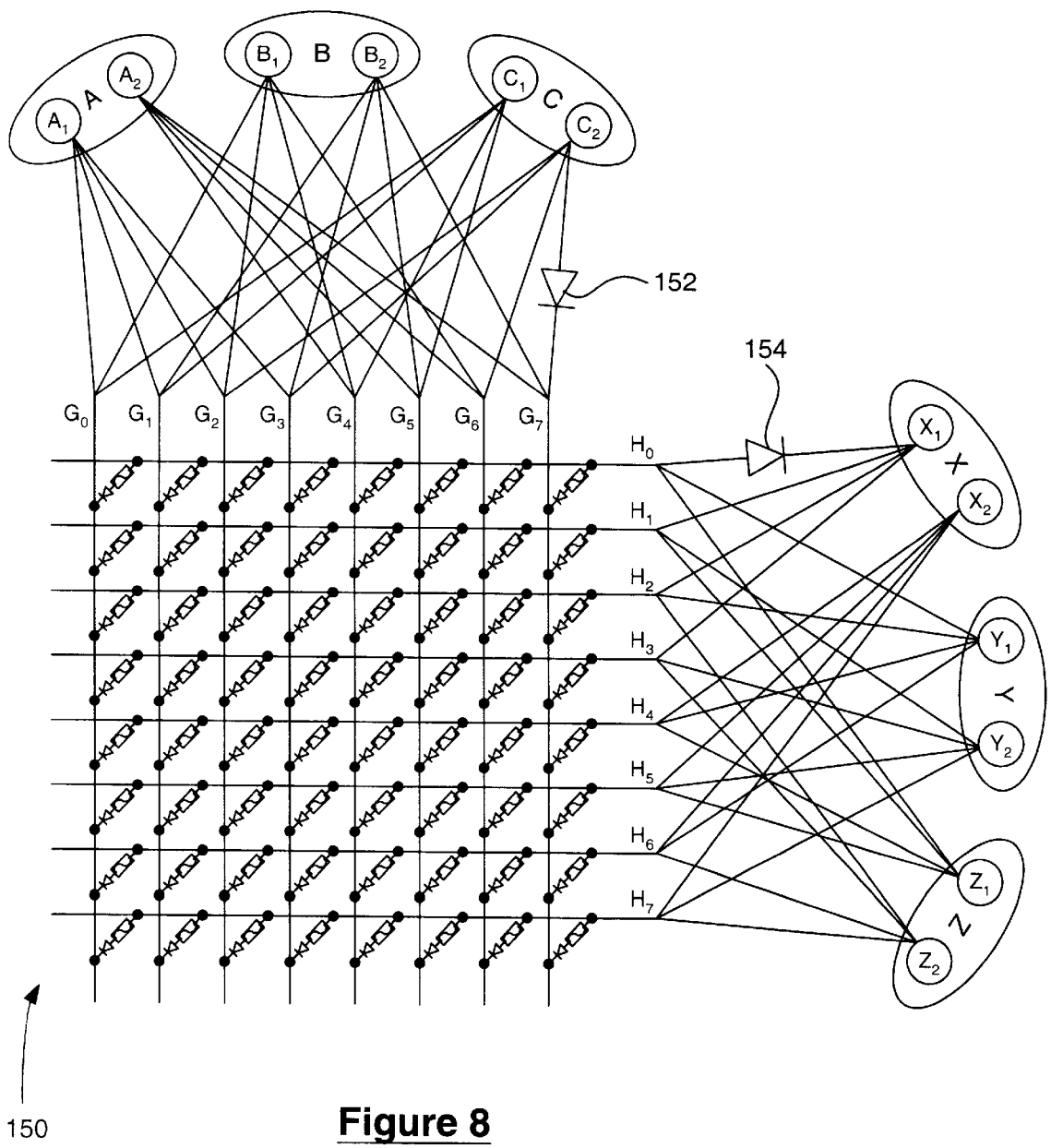
FIG. 8 shows a cross-point memory array with permuted diode logic addressing circuit connections illustrated schematically.

FIG. 8 schematically illustrates an 8×8 write-once memory array 150 having row and column electrodes coupled for addressing memory elements as described above. For reference, the column electrodes of the memory array 150 are labeled $G_0$ to $G_7$, and the row electrodes are labeled $H_0$ to $H_7$. Three addressing groups are provided each of the rows (X, Y, Z) and columns (A, B, C). Each of the addressing groups has two complementary addressing nodes (e.g. $A_1$ and $A_2$), and each node is coupled to four of the eight corresponding row/column electrodes. The connection pattern between the nodes and row/column electrodes is different for each addressing group. In the example of FIG. 8, the connection pattern is as follows:

| Column Electrode Address Node Connections | | | | | |
|---|---|---|---|---|---|
| $A_1$ | $A_2$ | $B_1$ | $B_2$ | $C_1$ | $C_2$ |
| $G_0$ | $G_4$ | $G_0$ | $G_1$ | $G_0$ | $G_2$ |
| $G_1$ | $G_5$ | $G_2$ | $G_3$ | $G_1$ | $G_3$ |
| $G_2$ | $G_6$ | $G_4$ | $G_5$ | $G_4$ | $G_6$ |
| $G_3$ | $G_7$ | $G_6$ | $G_7$ | $G_5$ | $G_7$ |
| Row Electrode Address Node Connections | | | | | |
| $X_1$ | $X_2$ | $Y_1$ | $Y_2$ | $Z_1$ | $Z_2$ |
| $H_0$ | $H_4$ | $H_0$ | $H_1$ | $H_0$ | $H_2$ |
| $H_1$ | $H_5$ | $H_2$ | $H_3$ | $H_1$ | $H_3$ |
| $H_2$ | $H_6$ | $H_4$ | $H_5$ | $H_4$ | $H_6$ |
| $H_3$ | $H_7$ | $H_6$ | $H_7$ | $H_5$ | $H_7$ |

The connections between the column electrodes and column addressing nodes each include a diode coupled as shown at 152, and the connections from row electrodes to row addressing nodes each include a diode coupled as shown at 154. Most of these diodes are not shown in the FIG. 8 diagram so as to avoid unnecessary complication. Although the topology in this example shows the address lines all connected to one end of the electrodes in the array, the address lines may just as easily be connected to either or both ends of the electrode (sides of the array).

The memory array 150 is addressed by applying voltages at the addressing nodes ($A_1$, $A_2$, etc.). An enabling voltage is applied at only one node from each addressing group. This allows a single memory element from the array 150 to be selected, in the manner described above in relation to FIG. 7.

A cross-point array of N memory elements requires $2\sqrt{N}$ row and column electrodes. These electrodes can be addressed by $2d^{2d}\sqrt{N}$ address lines where d is the order of the network. For example $10^8$ memory elements will require a total of 20000 row and column electrodes, but can be addressed by 400 lines with a second order network (2 groups of 100 nodes for the rows and the same for the columns) or 80 lines for a fourth order network (4 groups of 10 nodes for the rows and the same for the columns). In general, for a high order network the number of lines approaches 2d.

A difficulty that may be encountered with this sensing scheme is that the presence of even a small leakage current in a large ($10^8$) array of diodes can swamp the current from a single forward biased diode, making explicit sensing of the diode forward bias current difficult. One possible solution to this problem is to stripe the power supplies of the row and column electrodes so that only a small fraction of the array is active at any given time. In this case the address lines will still be active but will not apply bias to the memory diodes. The power supply striping can in fact form part of the addressing scheme to maintain interconnect efficiency.

Addressing Over Multiple Memory Module Layers

Some systems which are possible for sensing the state of an addressed memory element rely on the addressed diode memory element being the only current path between the row and column electrodes. If parallel addressing is used in the memory module, however, this creates the possibility of more than one conduction path between the row and column address lines, which creates difficulties in using that sensing scheme. Accordingly, a method and system for parallel detection of memory elements from multiple memory arrays is presented hereinbelow.

As mentioned, the preferred structure of a memory module herein disclosed comprises a stack of multiple layers. Each layer includes a write-once memory array, wherein the memory arrays of the various layers share common addressing lines so as to reduce the number of connections required to external circuitry. For example if a memory module consists of m layers each containing an array with N memory elements, $\sqrt{N}$ row electrodes and $\sqrt{N}$ column electrodes, then when the $i^{th}$ row and $j^{th}$ column are addressed on one layer they are addressed on all layers. This is desirable for two reasons. First, by being able to read m layers in parallel the read and write rates required to achieve a given serial bit rate are divided by m. Secondly, if separate address lines are required for each layer of the memory then the number of connections from layer to layer and from the memory module to the interface and control circuitry can become unmanageable.

The preferred solution to the parallel addressing difficulty involves including an additional sense diode to each row and/or column electrode at the same node to which the address diodes are connected. The other end of each row sense diode is connected to a common row sense line, and similarly the end of each column sense diode which is not connected to a respective column electrode is connected to a common column sense line. The state of an addressed memory element can be detected from either a row sense diode, a column sense diode, or both.

The state of an addressed memory bit is determined by the current which flows through the sense line to a suitably chosen bias point. In order for current to pass through either sense line two conditions must be met: (1) the diode memory element must be addressed, and (2) the fuse of that element must be blown. In all other cases the diode is not addressed and, regardless of the state of the fuse, the corresponding row and/or column sense diode will not be forward biased and will not conduct current. Therefore, if a single sense line is connected to all the row (or column) electrodes and one memory element in the row and column array is addressed, then the state of that memory element can be unambiguously determined.

The use of row and column sense lines provides redundancy without compromising the speed of the readout process and thereby improving the signal detection margin. Note that redundancy can also be added by including additional sense lines to either the row or column electrodes and/or by adding extra diodes in parallel to the connection between the sense lines and the row or column electrodes.

Figure 9:
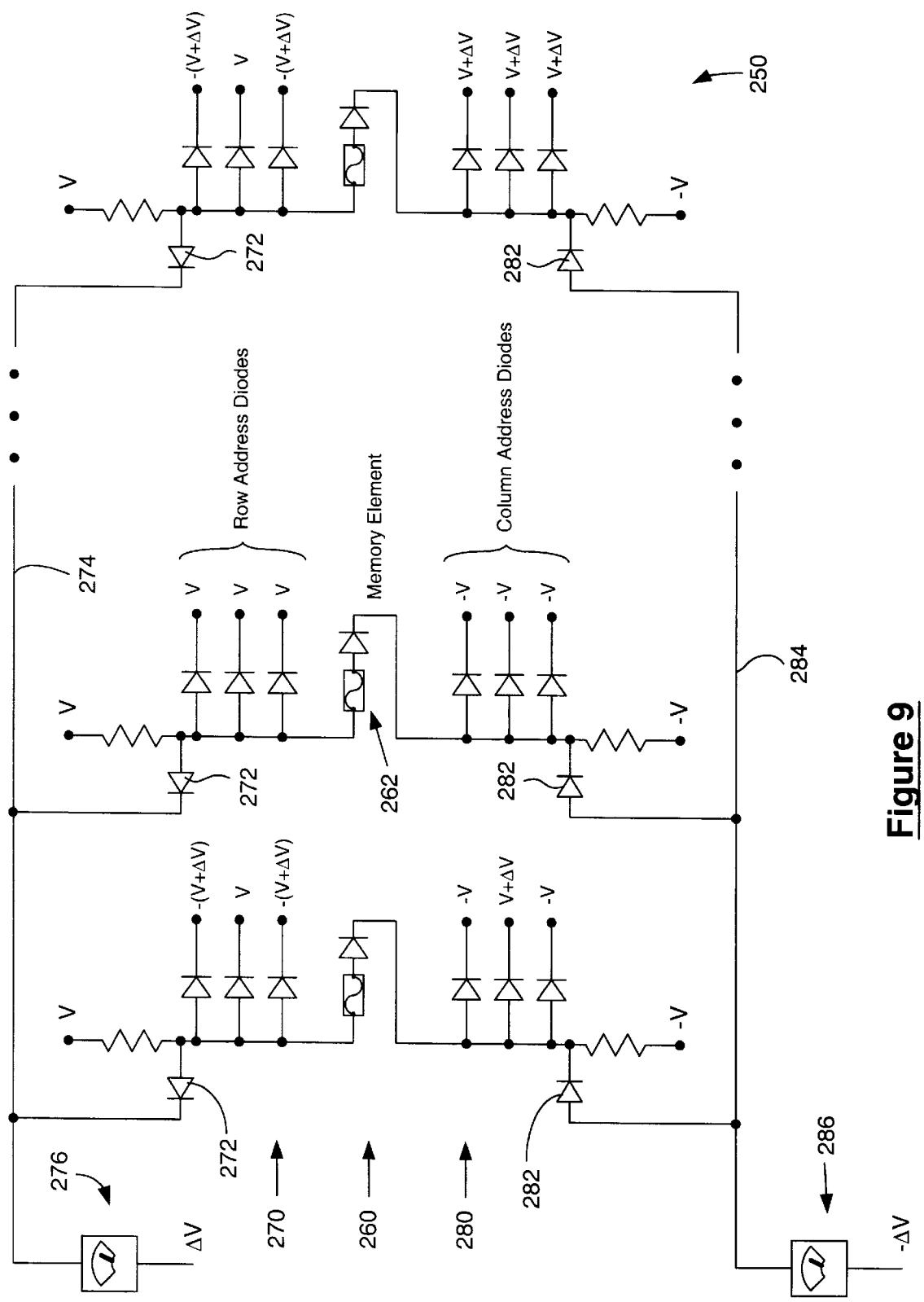
FIG. 9 is a schematic circuit diagram of a memory element sensing circuit.

FIG. 9 shows a schematic diagram of addressing and sensing circuitry 250 utilizing the techniques described above. A plurality of memory elements 260 from a write-once memory array are illustrated, coupled to their respective row and column addressing circuits 270, 280 which are constructed to address the memory array as described hereinabove. The circuitry 250 also includes a common row sense line 274 and a common column sense line 284. The common row sense line 274 is coupled to each of the memory array row electrodes through respective row sense diodes 272. In particular, each diode 272 has its anode coupled to the corresponding row electrode and its cathode coupled to the common row sense line. Similarly, column sense diodes 282 are coupled from the common column sense line 284 to the respective column electrodes of the memory array. The cathodes of diodes 282 are coupled to the respective column electrodes, and the anodes thereof coupled to the common column sense line.

In the example as shown the center memory element (262) is addressed. This is because memory element 262 is the one coupled to both the row and column electrodes that are selected by the addressing circuits. As shown in the Figure, memory element 262 corresponds to the addressing circuits in which none of its row or column address diodes are in conduction due to the voltages applied thereto. If the fuse of memory element 262 is blown then currents will flow through both sense diodes 272, 282 and in both the row and column sense lines 274 and 284. If the center memory element is intact then no currents will flow in either sense line regardless of the state of the fuses in any other memory elements in the array. In that case no current will flow through the sense diodes corresponding to the addressed memory element, and all other memory elements are unselected since the addressing scheme ensures that least one of the address diodes will be in conduction thereby guaranteeing that the corresponding sense diode will be reverse biased.

Figure 10:
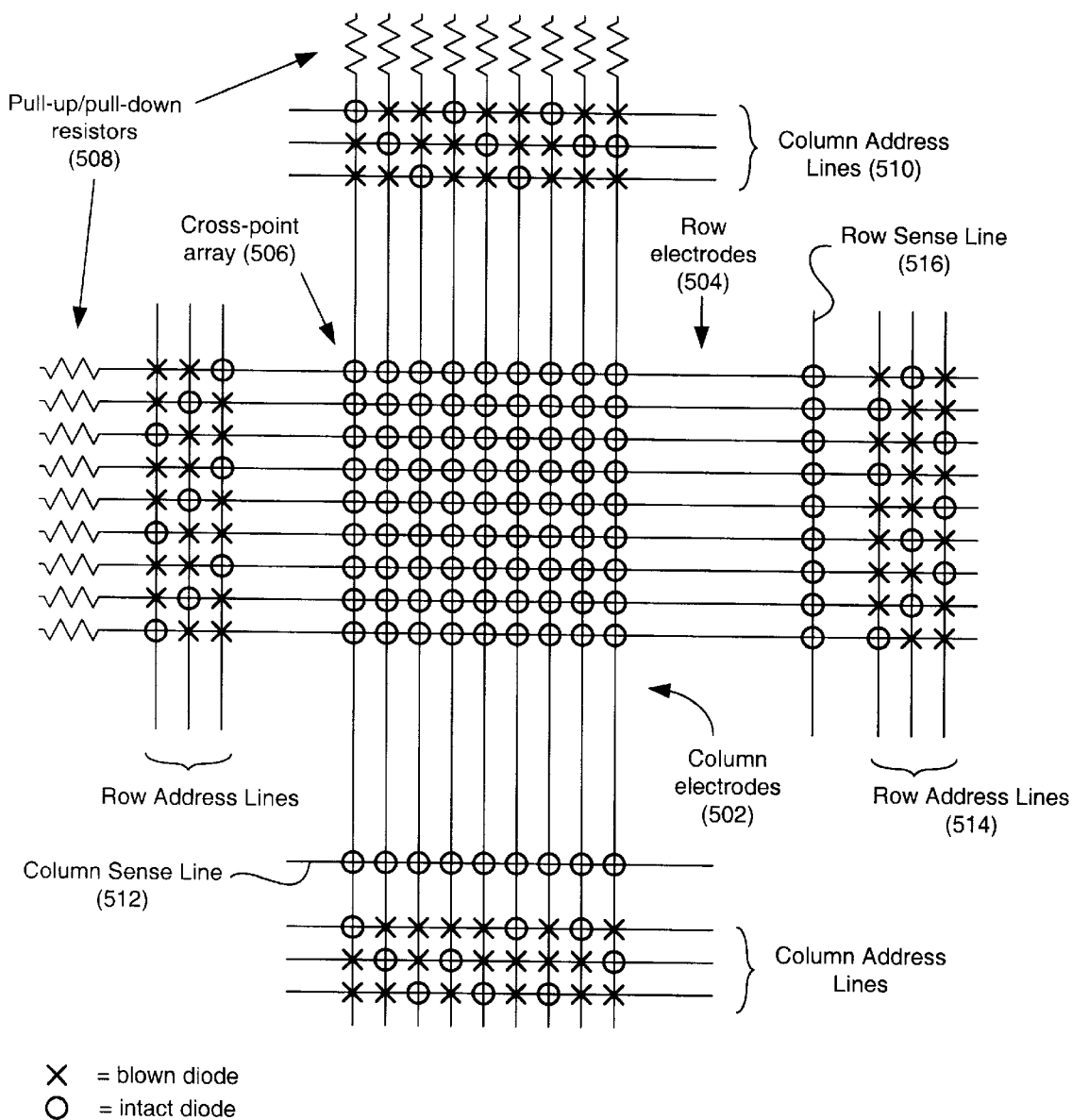
FIG. 10 is a diagrammatic layout view of a cross-point memory array and associated addressing and sensing circuit elements.

If more than one row or column electrode in the array is addressed then the state of the memory elements at the intersections of all the addressed lines may still be determined provided that at least one end of each memory element can be connected to a sense line which is separate from the others. This configuration will result in reduced detection margins. For example consider two addressed rows and one addressed column. If all the addressed fuses are intact then the sense diodes appear to be connected through two resistors in parallel to one of the power supply rails and through only one resistor to the other power supply rail. In order to be able to detect this condition the bias applied to the termination of the sense lines should be adjusted closer to one of the supply rail voltages, resulting in lower currents (smaller signals) when detecting the blown fuse condition. This is not a problem when each addressed row/column intersects at most one other addressed column/row as in the case when multiple cross-point arrays share the same address lines, but have their own sense lines, and in the case of a stack of cross-point memories or when multiple non-interconnected cross-point arrays exist on a single substrate. FIG. 10 is a diagrammatic layout diagram of a cross-point diode memory array with addressing and sensing circuitry of the form described above. As shown, column electrodes 502 and row electrodes 504 are orthogonal to one another and formed on respective layers separated by a semiconductor layer. Diodes are formed at the intersections of the electrodes, creating the cross-point diode memory array 506. In the Figure, diode elements that are intact are indicated by an "O" at the respective intersection, and diodes elements that are blown are indicated by an "X". The cross-point memory array as shown has no data stored in it and thus all of the diodes therein are intact.

The row and column electrodes extend out from the cross-point array and are terminated at their ends by pull-up/pull-down resistors 508 (corresponding to resistors 112, 122 in FIG. 7). Crossing the column electrodes between the memory array and the terminating resistors are a plurality of column address lines 510 and at least one column sense line 512. The column address lines and column sense line(s) are formed on the same conductor layer as the row electrodes so that where they cross the column electrodes diode junctions are formed therebetween. The diode elements formed by the column sense line corresponds to diodes 282 in FIG. 9, and the diodes formed by the column address lines correspond to diodes 280 in FIG. 9. The address line group/node arrangement described above is formed by blowing selected ones of the column address line elements, leaving intact the desired diode connections. This programming of the addressing circuitry can be finalized after fabrication of the circuits, as outlined below.

The row electrodes 504 are similarly crossed by row address lines 514 and a row sense line 516. The row address lines and row sense line are formed on the same conductor layer as the column electrodes, creating row address diodes (e.g. 270 in FIG. 9) and row sense diodes (e.g. 272 in FIG. 9).

At the time of fabrication, diode junctions are formed between each of the column address lines and each of the column electrodes, and between each of the row address lines and each of the row electrodes. However, in order to implement the group/node addressing scheme described above, it is necessary that only selected diode connections be maintained between addressing lines and array electrodes. The "programming" of the selected connections can be finalized after the circuit fabrication by blowing certain address diodes leaving only the selected diode connections intact. This is achieved by fabricating the address lines, for example, with a modulated line width so as to selectively vary the cross-sectional area of diode junctions to the array electrodes. As discussed above, the cross-sectional area of a given diode element can be adjusted to change the applied voltage/current that is necessary to reach the critical current density to blow that diode. Thus, the address line width is modulated so as to be narrower at certain cross-points with the array electrodes so that the diodes thereat have reduced cross-sectional areas. Then, when a programming voltage is applied to the circuits only those diodes with reduced area can be caused to blow, leaving the desired diode connections intact.

Leakage currents in the array during sensing can be minimized using the techniques mentioned above. For example, the power connections to the ends of the row and column electrodes can be arranged in groups or stripes, wherein only the region of the array where the addressed memory element resides has power applied to it, the remaining electrodes being coupled to a high impedance state. The parallel address sensing scheme described above is unaffected by turning the power off on unaddressed portions of the memory array. The power supply striping can be used as part of the addressing scheme to maintain interconnect efficiency.

Figure 11:
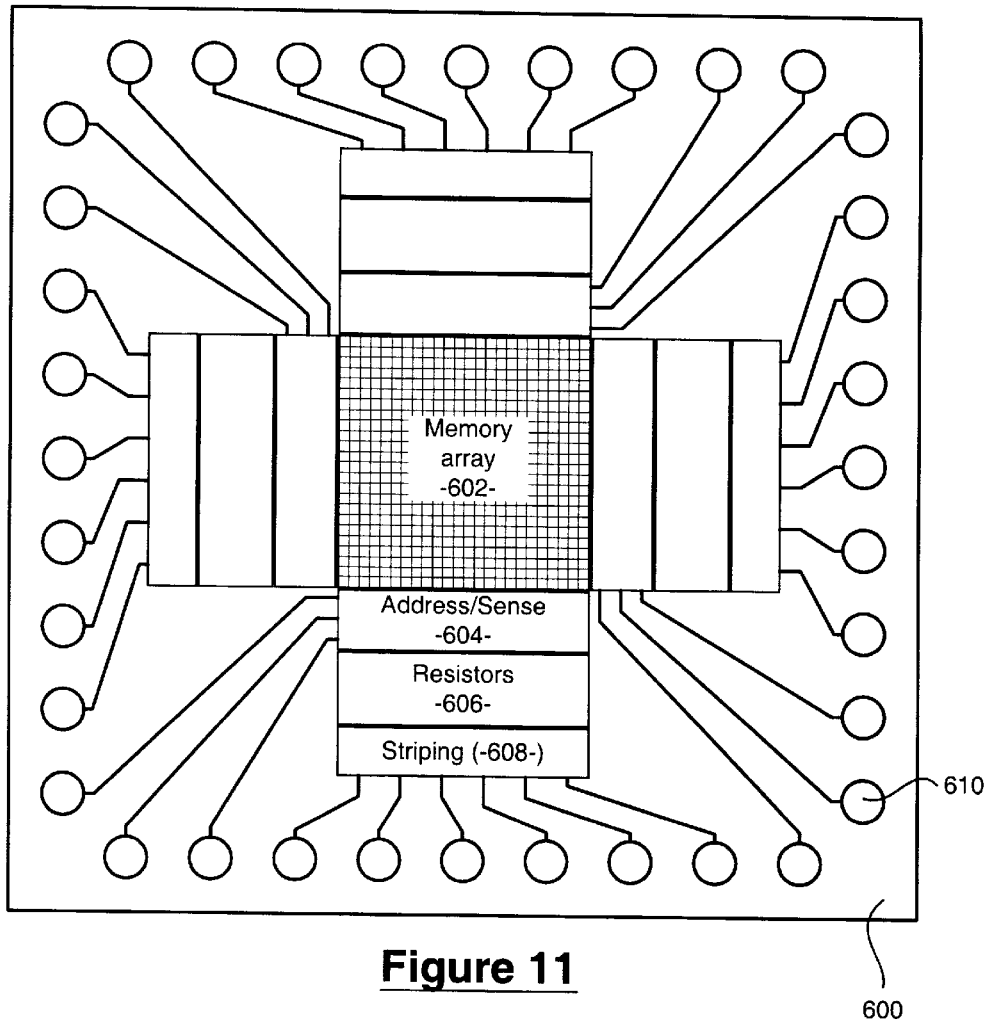
FIG. 11 is a simplified block architectural layout diagram of a memory module layer.

FIG. 11 illustrates a block architectural layout of a memory module layer 600 indicating an example of the relative positioning of the circuit components. The memory array 602 is positioned centrally, and at the periphery thereof are positioned address/sense lines 604, pull-up/pull-down resistors 606 and power supply striping couplings 608. Around the periphery of these circuits are located contact pads 610 for making external interconnections. It will be appreciated from the foregoing description that the physical architecture of the layer 600 is particularly simple, with the row/column electrodes extending out from the array through the address/sense circuits, resistors and striping connections to the interconnect contact pads. The address and sense lines are similarly arranged, and all of the diode circuit elements are automatically formed at the conductor cross-points (with certain diodes being later blown in programming as described above).

Figure 12:
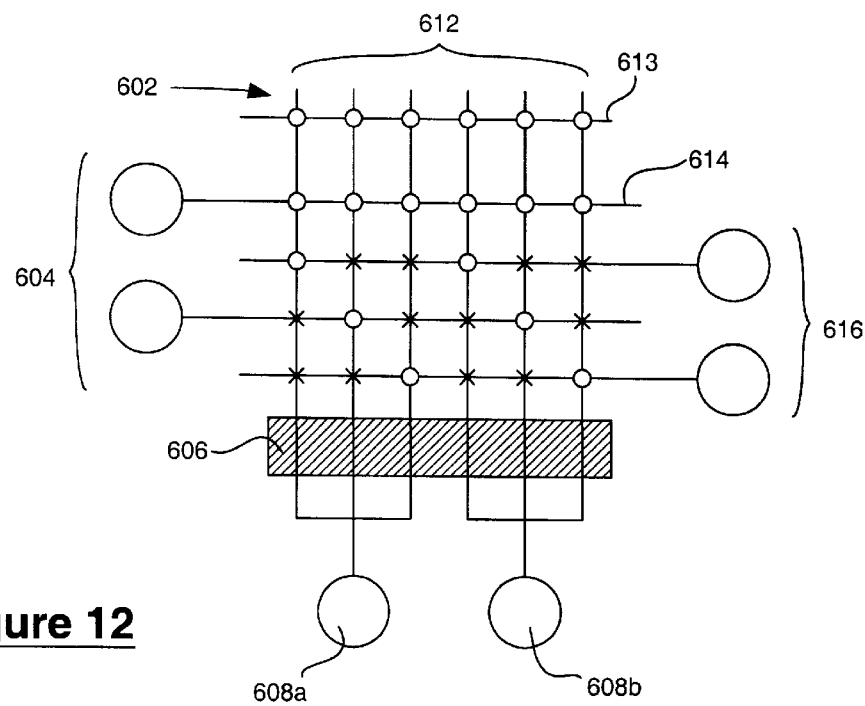
FIG. 12 is a diagrammatic layout view of a portion of memory array and addressing/sensing circuitry.

A portion of the memory module layer layout is shown in greater detail in FIG. 12. Here, a portion of a memory array 602 is shown with column electrodes 612 and row electrode 613. The column electrodes are crossed by a column sense line 614 and column address lines 616, forming the address/sense circuits 604. Pull-up/pull-down resistors are formed in the column electrodes at 606. The column electrodes are arranged into stripes, wherein groups of electrodes are coupled to separate power supply terminals 608a, 608b. The row electrodes (not shown) are similarly arranged. The power supply striping connections can be used as part of the addressing scheme as well as a mechanism to reduce leakage currents, by applying power to, and thereby selecting, only one portion (sub-array) of the memory array at a time.

Assuming that the address and power supply lines are bussed (common) to all of the layers in a memory module, writing data can be performed by addressing a bit on each layer and strobing the power supply in the active sub-array (determined by the power supply striping) from a read level to a write level. However, it must be possible to write different data states to different layers, and this can be achieved using the sense lines to pull down the voltage on layers where the memory element diode/fuse is to be protected. This means that the sense diodes must withstand a current that would blow the memory array elements. Accordingly, the sense diodes are fabricated with enlarged cross-sectional areas so as to reduce current density therethrough.

Another possible usage of redundant sense lines is to check the function of the memory before it is written. Information maybe gathered from inconsistent measurements from various sense lines in combination with various states of the power supply connections to the row and column electrode ends to reveal defective memory elements and/or defective addressing. This information maybe used to generate sparing tables that can be used to avoid writing to defective areas of the memory module and thereby improve the product tolerance to processing yields Integrated Circuit Structure The memory circuit of the preferred embodiment comprises a memory array and addressing circuitry can be formed, for example, according to a metal-semiconductor-metal (MSM) process on the plastic substrate 50. The MSM process results in two patterned layers of conductive metal circuits with one or more layers of semiconductor material therebetween. Where the metal layers cross and make contact to opposed sides of the semiconductor layer, a diode junction is formed between the metal layers. The production of MSM diode integrated circuits is described, for example, in the specification of International Patent Application Publication Number WO 99/39394, entitled "X-Y Addressable Electric Microswitch Arrays and Sensor Matrices Employing Them". The disclosure of that document is explicitly incorporated herein by reference. Further details of memory circuit fabrication and construction of a memory module of the kind described hereinabove may be found in the specification of the aforementioned co-pending U.S. patent application.

General Considerations

The memory system described herein has several features that make it particularly suitable for portable data storage applications such as in digital cameras (still picture and/or video), digital music players/recorders (e.g. MP3 players), personal digital assistants (PDAs), mobile telephones, etc. The memory system is able to provide data storage in capacities sufficient to be useful such appliances and can be produced at relatively low cost. Data can be written to the memory and thereafter it is permanently stored. Thus, a high capacity storage device (e.g. 100 MB to over 1 GB) can be provided at low cost (e.g. less than about $5) for permanent archival data storage with use in portable appliances.

The data storage is provided by a memory module that is produced at low cost by using inexpensive materials and processing technology. The memory module may be formed from a plurality of layers each having a cross-point memory array and addressing circuitry. Each layer can be formed on an inexpensive flexible substrate, such as polymer or dielectric coated metal film, which is much cheaper than a traditional single crystal silicon substrate and allows for relatively fast and inexpensive fabrication processes to be used. The circuitry formed on each layer, comprising the cross-point memory array and associated addressing circuits, is designed to be simple in structure to enable uncomplicated fabrication processing. In particular, the memory array and addressing circuits are designed according to a permuted diode logic regime which allows both the memory array and addressing circuits to be fabricated using the same simple process.

Each memory module layer has two sets of electrode conductors arranged in respective layers with a semiconductor layer therebetween. The electrodes are arranged in an orthogonal matrix and at the intersection point of each pair of crossing electrodes a memory element is formed in the semiconductor material. The semiconductor layer allows for low temperature processing so as to be compatible with the plastic substrate, and may be an amorphous silicon material or constructed from one or more organic semiconductor materials. Where the electrode layers cross, separated by the semiconductor layer, a rectifying junction is formed between the two electrode conductors. Each rectifying junction can be considered as a diode in series with a fuse element, and such junctions form the basis of the memory array and the diode logic addressing circuits.

The addressing circuitry included on a memory module layer facilitates a reduction in the number of externally accessible addressing lines that are required to read from or write to the memory elements in an array. This facilitates, for example, a manageable number of the interconnections from a layer in the memory module to external circuitry reading and writing, and the like. For example, using the permuted diode logic addressing scheme described a memory array of 100,000,000 bits can be addressed by 56 external addressing lines. Power supply striping can also be used, wherein power is supplied to only a portion of the memory array at a time, which reduces leakage currents in the array and can also form part of the memory array addressing scheme.

Interface and control circuitry is separate from the memory module, constructed for example in the form of a convention integrated circuit or circuits. The interface and control circuitry includes a circuit for generating addressing signals to be applied to the memory module, and a sensing circuit for reading stored data. The sensing scheme is based on electrical current levels rather than electric charge, which allows the sensing circuitry to more easily read data remotely from the memory module. Furthermore, the data storage is based on a large resistance change when a memory element fuse is blown, which provides relatively large sensing signals.

As the data storage in the memory module is separate from the interface and control circuitry, the memory module can be replaced when it has reached storage capacity and another memory module can be used with the same interface and control circuitry. This means that most reusable components of th e memory system do not have to be replaced when more data storage is required. Also, the interface and control circuitry can be relatively complex because it is not limited by the memory module fabrication process, and can be relatively expensive since it represents a one time cost in the memory system. This can be exploited by providing sophisticated error detection and correction capability in the interface and control circuitry which allows the memory system to be error tolerant despite remote sensing and able to cope with imperfectly fabricated memory modules thereby increasing the number of useable memory modules from an imperfect fabrication process yield.

The foregoing detailed description of a preferred embodiment of the present invention is presented by way of example only, and many variations to the circuits, structures, arrangements and processes described are possible without departing from the scope of the invention. For example, the memory addressing system of the preferred embodiment is described primarily in the context of a memory module having a plurality of layers of memory circuits, however it will be readily recognized that many other applications are possible.

The structure of the memory module also has many possible variations whilst retaining the principles of the present invention. In the described embodiment a single memory array is fabricated on each layer, and the layers are aligned and stacked in top of one another. Each layer could alternatively include more than one memory array, and the layers could also be stacked in a different way, such as a fan-fold stack. It may also be advantageous in some applications to fabricate multiple circuit layers built up on a single substrate.

The principles of the present invention can be applied with many other variations to the circuits, structures, arrangements and processes described herein, as will be apparent to those of ordinary skill in the art, without departing from the scope of the invention as defined in the appended claims.

We claim:

1. An addressing circuit for addressing a cross-point memory array having first and second sets of electrodes from first and second sets of address lines, the addressing circuit comprising:
   first diode connections between said first set address lines and said first set memory array electrodes, said first diode connections coupling each memory array electrode in the first set to a respective unique subset of the first set address lines;
   second diode connections between said second set address lines and said second set memory array electrodes, said second diode connections coupling each memory array electrode in the second set to a respective unique subset of the second set address lines; and
   at least one sense line with diode connections to each of the first set memory array electrodes and/or the second set memory array electrodes.

2. An addressing circuit as claimed in claim 1, including first and second sense lines, the first sense line having diode connections to each of said first set memory array electrodes, and the second sense line having diode connections to each of said second set memory array electrodes.

3. An addressing circuit as claimed in claim 1, wherein the diode elements of the first diode connections are oriented differently from the diode elements of the second diode connections with respect to the memory array electrodes and address lines.

4. An addressing circuit as claimed in claim 3, wherein the first diode connections comprise diodes elements with anodes coupled to the respective memory array electrodes and cathodes coupled to the respective address lines, and the second diode connections comprise diode elements with cathodes coupled to the respective memory array electrodes and anodes coupled to the respective address lines.

5. An addressing circuit as claimed in claim 1, wherein the cross-point memory array comprises an array of diode based memory elements formed at cross-points of electrodes from said first and second sets, with ends of the electrodes coupled to power supply connections through respective resistive elements.

6. An addressing circuit as claimed in claim 5, wherein the power supply connections are arranged in power supply striping groups to enable power to be selectively supplied to portions of the cross-point array.

7. An addressing circuit as claimed in claim 1, wherein a plurality of cross-point memory arrays each have respective first diode connections, second diode connections and at least one sense line, the address lines being coupled in parallel to the plurality of first and second diode connections.

8. An integrated circuit including a plurality of cross-point diode memory arrays and addressing circuit as claimed in claim 7.

9. An integrated circuit including a cross-point diode memory array and an addressing circuit as claimed in claim 1.

10. An integrated circuit as claimed in claim 9, wherein the cross-point diode memory array and addressing circuit are formed in the same fabrication process.

11. A memory circuit comprising:
    a cross-point memory array having first and second sets of transverse electrodes with respective memory elements formed at the crossing-points of the first and second set electrodes, each memory element including, in at least one of its binary states, a diode element; and
    an addressing circuit comprising:
       a first set of address lines with first diode connections between said first set address lines and said first set memory array electrodes, said first diode connections coupling each memory array electrode in the first set to a respective unique subset of the first set address lines;
       a second set of address lines with second diode connections between said second set address lines and said second set memory array electrodes, said second diode connections coupling each memory array electrode in the second set to a respective unique subset of the second set address lines; and
       at least one sense line with diode connections to each of the first set memory array electrodes and/or the second set memory array electrodes.

12. A memory circuit as claimed in claim 11, wherein the diode elements of the first diode connections are oriented differently from the diode elements of the second diode connections with respect to the memory array electrodes and address lines.

13. A memory circuit as claimed in claim 11, wherein ends of the memory array electrodes are coupled to power supply connections through respective resistive elements, with the power supply connections being arranged in power supply striping groups to enable power to be selectively supplied to portions of the cross-point array.

14. A memory circuit comprising a plurality of cross-point memory arrays and respective addressing circuits as claimed in claim 11, wherein the address lines from the respective addressing circuits are coupled in parallel.

15. A memory circuit as claimed in claim 11, wherein the addressing circuit includes first and second sense lines, the first sense line having diode connections to each of said first set memory array electrodes, and the second sense line having diode connections to each of said second set memory array electrodes.

16. A memory circuit as claimed in claim 11, wherein the first diode connections are formed at crossing-points of the first address lines and the first memory array electrodes, and the second diode connections are formed at crossing-points of the second address lines and the second memory array electrodes.

17. A memory system including a plurality of memory circuits as claimed in claim 11, wherein the first and second sets of address lines from the plurality of memory circuits are coupled to receive addressing signals in parallel, and wherein the at least one sense line from each of the plurality of memory circuits is separate.

18. An integrated circuit having at least one memory circuit as claimed in claim 11.

19. An integrated circuit as claimed in claim 18, wherein the memory array and addressing circuit are formed in the same fabrication process.

20. A memory module comprising a plurality of integrated circuits as claimed in claim 18.

21. A memory module as claimed in claim 20, wherein the first and second sets of address lines from the plurality of memory circuits are coupled to receive addressing signals in parallel, and wherein the at least one sense line from each of the plurality of memory circuits is separate.

22. An integrated circuit as claimed in claim 18, formed on a dielectric substrate surface.

23. A memory module comprising a plurality of integrated circuits as claimed in claim 22.

24. A memory module as claimed in claim 23, wherein the plurality of integrated circuits are stacked on top of one another.

25. A method for addressing a cross-point memory array having first and second sets of electrodes from first and second sets of address lines, comprising:

forming first diode connections between said first set address lines and said first set memory array electrodes, said first diode connections coupling each memory array electrode in the first set to a respective unique subset of the first set address lines;

forming second diode connections between said second set address lines and said second set memory array electrodes, said second diode connections coupling each memory array electrode in the second set to a respective unique subset of the second set address lines;

providing at least one sense line with diode connections to each of the first set memory array electrodes and/or the second set memory array electrodes; and addressing a memory element in the memory array by applying a predetermined electrical signals to said first and second set address lines to enable detection of the state of said memory element using said at least one sense line.

26. A method as claimed in claim 25, wherein said first and second diode connections and said at least one sense line are formed during the same fabrication process as the cross-point memory array.

27. A method as claimed in claim 25, wherein a plurality of cross-point memory arrays are formed with respective first and second diode connections and sense lines, and wherein said predetermined electrical signals are applied to the address lines of the plurality of memory arrays in parallel to obtain separate memory element sense outputs on the respective sense lines.

28. A method as claimed in claim 25, wherein the at least one sense line functions as a write enable line for enabling or preventing writing to an addressed memory element according to a predetermined electrical signal applied to the at least one sense line.

29. A method as claimed in claim 28, wherein a plurality of cross-point memory arrays are formed with respective first and second diode connections and sense lines, and wherein said predetermined electrical signals are applied to the address lines of the plurality of memory arrays in parallel so as to address corresponding memory elements in each of the cross-point memory arrays.

* * * * *